US008456198B2

(12) United States Patent
Summer

(10) Patent No.: US 8,456,198 B2
(45) Date of Patent: Jun. 4, 2013

(54) RADIATION TOLERANT COMPLEMENTARY CASCODE SWITCH USING NON-RADIATION HARDENED TRANSISTORS

(76) Inventor: Steven E. Summer, Plandome, NY (US)

( * ) Notice: Subject to any disclaimer, the term of this patent is extended or adjusted under 35 U.S.C. 154(b) by 46 days.

(21) Appl. No.: 12/831,415

(22) Filed: Jul. 7, 2010

(65) Prior Publication Data

US 2012/0007656 A1 Jan. 12, 2012

(51) Int. Cl.
*H03K 3/00* (2006.01)

(52) U.S. Cl.
USPC .......... 327/108; 327/112

(58) Field of Classification Search
USPC .......... 327/108–112
See application file for complete search history.

(56) References Cited

U.S. PATENT DOCUMENTS

| | | | | |
|---|---|---|---|---|
| 4,893,091 | A * | 1/1990 | Lillis et al. | 330/253 |
| 5,282,122 | A | 1/1994 | Summer | |
| 5,430,341 | A | 7/1995 | Summer | |
| 6,876,235 | B2 * | 4/2005 | Li et al. | 327/112 |
| 6,982,883 | B2 | 1/2006 | Summer | |
| 7,112,989 | B2 * | 9/2006 | Ooshita et al. | 326/27 |
| 7,132,877 | B2 | 11/2006 | Summer | |
| 7,135,846 | B2 | 11/2006 | Summer | |
| 7,215,174 | B1 | 5/2007 | Summer | |
| 7,477,096 | B2 | 1/2009 | Summer | |
| 7,495,498 | B2 | 2/2009 | Summer | |
| 7,635,970 | B2 | 12/2009 | Summer | |
| 7,636,248 | B2 | 12/2009 | Summer | |
| 2005/0207186 | A1 | 9/2005 | Summer | |
| 2006/0049864 | A1 | 3/2006 | Summer | |
| 2006/0076999 | A1 | 4/2006 | Summer | |
| 2006/0077696 | A1 | 4/2006 | Summer | |
| 2006/0082939 | A1 | 4/2006 | Summer | |
| 2006/0104095 | A1 | 5/2006 | Summer | |
| 2006/0176627 | A1 | 8/2006 | Summer | |
| 2006/0181905 | A1 | 8/2006 | Summer | |
| 2009/0015226 | A1 | 1/2009 | Summer | |

OTHER PUBLICATIONS

Bell B., "Two-Switch Topology Benefits Forward and Flyback Power Converters", *EDN* (3 pages) (2000).
Chemistruck A., "Photovoltaic Power Interface: Two Switch Forward DC/DC Converter", *Proton Energy Systems* (13 pages) (2005).

* cited by examiner

*Primary Examiner* — Kenneth B. Wells
(74) *Attorney, Agent, or Firm* — Scully, Scott, Murphy & Presser PC

(57) ABSTRACT

A power switching circuit designed for operating in a radiation environment using non-radiation hardened components is provided. The power switching circuit provides a high-voltage rated, non-radiation hardened N-channel FET (N-FET) controlled by a relatively small, low-voltage, non-radiation hardened P-channel FET (P-FET), while both devices are operating in a radiation environment. The P-FET device is drive by a sufficiently high drive voltage in order to overcome gate threshold shifts resulting from accumulated radiation damage.

32 Claims, 3 Drawing Sheets

100
110
116
112
106
106D
106S
106G
102
102S
102D
102G
104
109
114
108

210
214
306C
306E
306
306G
236
216
260
202
202S
202D
202G
270
238
250
228
230
232
224
222
212C
212B
212A
212
226
220
218
208
204

RADIATION TOLERANT COMPLEMENTARY CASCODE SWITCH USING NON-RADIATION HARDENED TRANSISTORS

FIELD OF THE INVENTION

This invention relates to power switching circuits. More specifically, the invention relates to a radiation tolerant complementary cascade switch using non-radiation hardened transistors.

BACKGROUND OF THE INVENTION

One type of field effect transistor (FET) used for power switching is an enhancement mode type FET. An enhancement mode FET is normally non-conducting. However, when a gate voltage above a threshold value is applied, the enhancement mode FET becomes conducting. Additionally, enhancement mode FETs are available in two gate polarities: N-channel and P-channel.

Power switching circuits designed for general purpose use are usually constructed with N-channel FETs because, for any given die size, the N-channel FET has a lower ON resistance than a correspondingly sized P-channel FET would have.

For clarity, several terms used herein are defined. The term "radiation hardened" in the context of the present invention is understood to refer to components and/or circuits, which have been explicitly designed and/or tested to operate at a specified operating point under defined radiation levels and exposure duration. In contrast, "non-radiation hardened" electronic components are standard, commercially available components that have not been tested or rated for operation in radiation environments.

Moreover, radiation environment within the context of the present invention refers to an operating environment of a circuit in which the circuit will be exposed to one or more forms of electromagnetic radiation, for example, ionizing radiation, that generally cause deterioration to electronic components.

The conventional switching devices in radiation environments use specially designed radiation hardened N or P-channel FETs. The principal benefit of these radiation hardened N or P-channel FETs is that the gate threshold voltage does not change substantially after being exposed to radiation. However, because these components are in limited demand, the supply is correspondingly lower than for similar commercial-grade components. The limited supply for radiation hardened components leads to increased cost and may increase production lead times. These factors result in higher prices and longer delivery times for the radiation tolerant circuits that incorporate these types of components.

If a conventional non-radiation hardened N-channel FET is used in switching applications where radiation is present, the device tends to fail at relatively low radiation levels because the gate threshold voltage of the N-channel FET shifts more negatively with accumulated radiation dose, and ultimately falls through zero to a negative voltage. Below a zero voltage threshold, the N-channel FET conducts current with little or no gate voltage applied. Therefore, the component is difficult to control after the initial application of power.

The gate threshold voltage of a conventional, non-radiation hardened P-channel FET also shifts more negative as it is exposed to accumulated radiation dose. However, the initial threshold voltage is negative. Therefore, the gate threshold voltage never goes through a region where the FET is uncontrollable, it only shifts from a negative value to a more negative value. Consequently, conventional P-channel FETs can be more immune to total dose effects than conventional N-channel FETs if the proper gate drive signal is provided.

Therefore, it is desirable to provide a power switching circuit using an N-channel FET that minimizes the deleterious effects described above in a radiation environment.

SUMMARY OF THE INVENTION

An embodiment of the present invention is a power switching circuit for radiation environments using non-radiation hardened components. The power switching circuit includes a first semiconductor switching device having a positive threshold voltage and a first region coupled to a high voltage source; and a second semiconductor switching device having a negative threshold voltage. The second semiconductor switching device has a source coupled to a second region of the first semiconductor switching device, and a gate coupled to a signal generating circuit.

In the present embodiment, the first semiconductor switching circuit is an N-channel FET and the second semiconductor switching device is a P-channel FET. The first region of the N-channel FET is a drain and the second region of the N-channel FET is a source.

Alternatively, the first semiconductor switching circuit is an insulated-gate bipolar transistor (IGBT) and the second semiconductor switching device is a P-channel FET. The first region of the IGBT is a collector and the second region of the IGBT is an emitter.

BRIEF DESCRIPTION OF THE DRAWINGS

These and other features, aspects, and advantages of the present invention will become better understood with regard to the following description, appended claims, and accompanying drawings wherein:

DETAILED DESCRIPTION OF INVENTION

The present invention provides the ability to use a high voltage rated, non-radiation hardened N-channel FET (N-FET) controlled by a relatively small low voltage, non-radiation hardened P-channel FET (P-FET) while both devices operate within a radiation environment. High voltage in the present invention refers to voltages at or above 50V DC.

In the present invention, the P-FET device is driven by a sufficiently high drive voltage in order to overcome gate threshold shifts resulting from accumulated radiation damage. This ability of the circuit to operate within design parameters while being exposed to predefined levels of radiation is referred to herein as "radiation tolerance", and the circuit meeting this criteria, as "radiation tolerant".

The ON state, negative gate-to-source drive waveform provided to the P-FET must have a sufficiently large magnitude to saturate the drain-to-source channel. It must, however, not be so high that the gate-to-source breakdown voltage rating of the P-FET is exceeded. It is important to maximize the magnitude of the gate voltage signal, because the higher the signal magnitude, the higher radiation dose the P-FET will tolerate and still work within the design parameters of the circuit.

The OFF state gate-to-source drive signal must be sufficiently low to reduce current flow through the drain-to-source channel of the P-FET. However, it must not be so high in positive magnitude that the gate can rupture due to passage of high energy particles normally encountered in radiation environments.

In the present invention, a FET is considered to be any of the various transistor types that utilize an electric field effect to control the conductivity of a charge carrier channel in a semiconductor material, where the charge carrier is of a single type. Examples of FETs that can be used in the present invention include, but are not limited to, Junction Field-Effect Transistor (JFET), Metal-Oxide-Semiconductor Field-Effect Transistor (MOSFET), Insulated-Gate Bipolar Transistor (IGBT), and Metal-Semiconductor Field-Effect Transistor (MESFET). Additionally, in place of FETs other semiconductor switching devices may be used that exhibit similar properties as FETs in a radiation environment.

Figure 1:
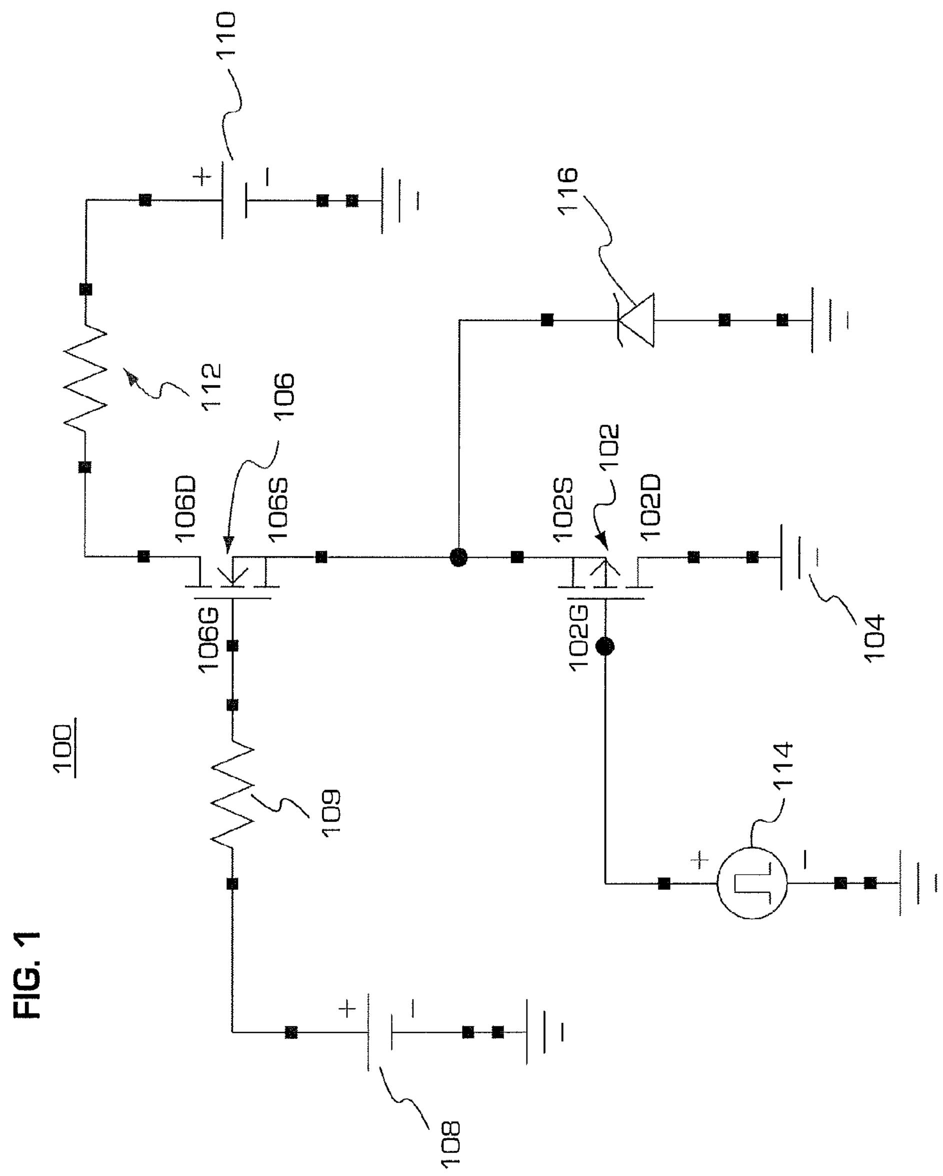
FIG. 1 is a circuit schematic representing a direct-drive implementation of the present invention.

FIG. 1 shows a circuit schematic of a direct drive embodiment of the invention. In the present embodiment, a drain terminal 102D of a P-channel FET 102 is connected to ground 104. A source terminal 1025 of the P-channel FET 102 is connected in series with a source terminal 106S of an N-FET 106. A gate 106G of the N-FET 106 is coupled to a 10 VDC source 108 through resistor 109, which provides a positive biasing voltage to the N-FET 106. Load resistor 112 is connected between a 500 VDC supply 110 and the drain 106D of the N-FET 106.

When the gate terminal 102G of the P-FET 102 is driven negative by pulse generator 114, the P-FET 102 saturates, grounding the source terminal 106S of the N-FET 106. Since the gate 106G is connected to a positive bias source, i.e., the 10 VDC source 108, the N-FET 106 also saturates concurrently with the P-FET 102. This applies the full voltage to load resistor 112.

A zener diode 116 is coupled between the P-FET source 1025 and ground. The zener diode 116 forms a clamping circuit that limits the drain-to-source voltage across P-FET 102 and protects the device from transients.

The silicon die area required for the low voltage rated P-FET 102 is much smaller than the silicon die area required for high voltage rated N-FET 106. Typically, the drain-to-source voltage rating of the P-FET 102 would be 30 VDC, while the drain-to-source voltage rating of the N-FET 106 would be 1000 VDC. In addition, the ON resistance of the P-FET 102 would be expected to be much lower than the ON resistance of N-FET 106 (due to the difference in drain-to-source rating), Therefore, the addition of the P-FET 102 does not significantly increase the conduction losses.

The circuit 100 will function properly over a wide range of ionizing radiation, typically beyond 200 Krads. As the ionizing radiation dose accumulates, the threshold voltage of N-FET 106 will drop from positive to negative. At the same time, the threshold voltage of P-FET 102 will start at a negative level and increase relatively linearly to a more negative level.

Therefore, as long as a sufficiently high magnitude gate drive voltage is applied, by the pulse generator 114, to P-FET 102, the combined switch circuit will function controllably. The magnitude of the gate drive voltage is considered significantly high if the gate drive voltage saturates the drain-to-source channel without exceeding the breakdown threshold rating of the P-FET 102, even after exposure to radiation.

For example, in a radiation environment the P-FET may be derated by, for example, 25% to increase the tolerance of the circuit. The gate drive voltage in such a case would be considered sufficiently high when the gate drive voltage is as close to the derated threshold as possible without exceeding the threshold.

Thus, the actual magnitude of the gate drive voltage must be determined for each application based on the P-FET operating characteristics, overall circuit design, and operating environment. The gate drive voltage of P-FET 102 is designed so that the criteria for optimum P-FET drive voltage requirements for operating in radiation environments described above are met. Although a resistive load (i.e. resistor 112) is shown in FIG. 1, the circuit will also drive inductive and capacitive loads such are used in power supplies and solid-state motor commutators.

Transformer Coupled Embodiment of the Invention

It is very useful in power supply and other applications to be able to control the switch from an isolated signal. In applications intended for high levels of ionizing radiation, transformer isolation is particularly useful since transformers are generally not affected by ionizing radiation.

Figure 2:
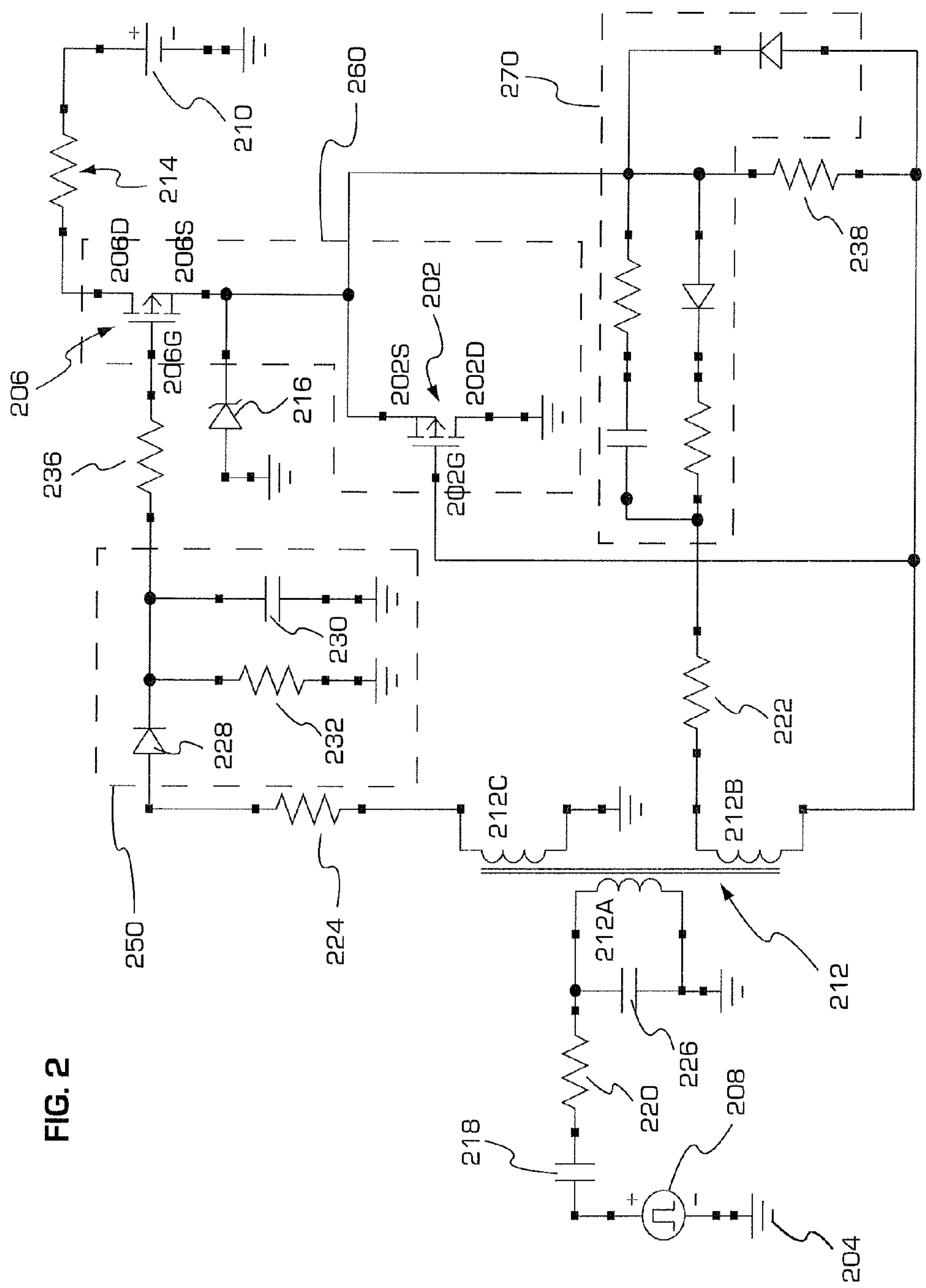
FIG. 2 is a circuit schematic representing a transformer-coupled implementation of the present invention.

The schematic shown in FIG. 2 is a transformer-coupled embodiment of the invention, which contains the following elements: The drive signal is a pulsating signal generated by pulse generator 208. Typically, the amplitude of the pulse is 15 VDC, the frequency of the pulse is 200 kHz, and the duty cycle of the pulse is 20%.

The pulse waveform is capacitively coupled through capacitor 218 to transformer primary 212-A. Resistances 220, 222, and 224 represent the winding resistance of the transformer 212. Capacitor 226 represents the lumped parasitic capacitance of the transformer 212. Consequently, resistances 220, 222, and 224 and capacitor 226 are not actual separate circuit components, but rather inherent properties of the transformer 212.

Diode 228 and capacitor 230 form a peak detector operating from the transformer secondary winding 212-C. Resistor 232 functions as a bleeder resistor to allow the capacitors and other energy storing components in the circuit to discharge when the circuit is turned off. These components, in conjunction with the transformer winding 212-C, provide a positive bias source 250 for N-FET 206.

The drain terminal 202D of P-FET transistor 202 is connected to ground 204. The P-FET source terminal 202S is connected in series with the N-FET source terminal 206S. The N-FET gate 206G is connected to the positive bias source 250 described above through resistor 236.

Load resistor 214 is connected to the 500 VDC supply 210 at a first end, and to the N-FET drain terminal 206D at a second end. The switch 260, defined by the coupled N-FET 206 and P-FET 202, is controlled by pulses obtained from transformer winding 212-B. A damping network and DC restoration function is provided by the capacitor, resistors and diodes enclosed in the dotted rectangle 270. Resistor 238 functions as a bleeder resistor for discharging the capacitor when the circuit is turned off.

When the P-FET gate terminal 202G is driven negative by the DC pulses generated from the transformer winding 212-B, the P-FET 202 saturates, grounding the N-FET source terminal 206S. Since the N-FET gate 206G is connected to the positive bias source 250, the N-FET 206 also saturates concurrently with the P-FET 202. As a result, the full voltage is applied to the load resistor 214. A zener diode 216, disposed between the P-FET source terminal 202S and ground 204, limits the drain-to-source voltage across the P-FET 202 and protects the device from transients.

Consequently, the circuit shown in FIG. 2 will function properly over a wide range of ionizing radiation, typically beyond 200 Krads. As the ionizing radiation dose accumulates, the threshold voltage of N-FET 206 will drop from positive to negative. At the same time, the threshold voltage of P-FET 202 will start at a negative level and increase relatively linearly to a more negative level. Therefore, as long as a sufficiently high magnitude gate drive is applied to the P-FET 202, the combined switch circuit will function controllably.

The gate drive of the P-FET 202 is designed so that the criteria for optimum P-FET drive requirements for operating in radiation environments described above is met. Although a resistive load is shown in FIG. 2, the circuit will also drive inductive and capacitive loads such are used in power supplies and solid state motor commutators.

Transformer Coupled Embodiment of the Invention Using IGBT

Figure 3:
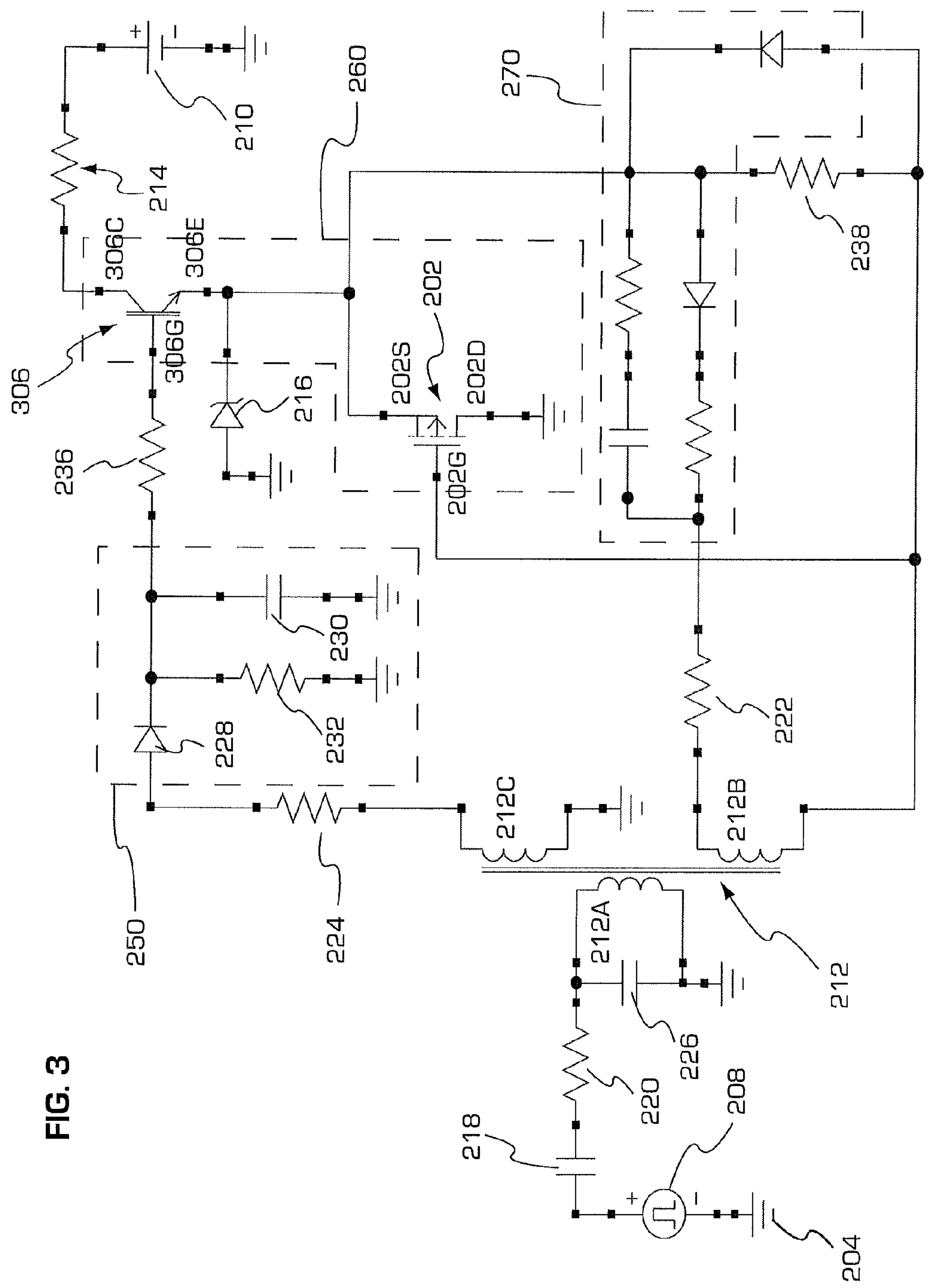
FIG. 3 is a circuit schematic representing another transformer-coupled implementation of the present invention.

FIG. 3 is similar to FIG. 2, except a high voltage insulated-gate bipolar transistor (IGBT) 306 is substituted for the high voltage N-FET 206 of FIG. 2. An IGBT is often preferred in motor drive applications, and are available in higher voltage ratings than the N-FET. The remainder of the circuit in the present embodiment is similar to the circuit shown in FIG. 2. Therefore, in FIG. 3 all components that are identical to the components in FIG. 2 are identified with the matching reference numerals.

In the embodiments shown in FIG. 2 and FIG. 3 the transformer has three windings, allowing isolated control of the switch and a positive bias for the N-FET 206 in FIG. 2 or the IGBT 306 in FIG. 3.

In the present embodiment, when the P-FET gate terminal 202G is driven negative by the DC pulses generated from the transformer winding 212-B, the P-FET 202 saturates, grounding the emitter terminal 306E of the IGBT 306. Since the gate terminal 306G of the IGBT 306 is connected to the positive bias source 250, the IGBT 306 also saturates concurrently with the P-FET 202. As a result, the full voltage is applied to the load resistor 214, which is disposed between the 500V DC supply 210 and the collector terminal 306C of the IGBT 306. A zener diode 216, disposed between the P-FET source terminal 202S and ground 204, limits the drain-to-source voltage across the P-FET 202 and protects the device from transients.

It should be understood that the specific values provided above for voltages and operating parameters of the components are intended for illustrative purposes only, and are not intended to limit the present invention to solely those values disclosed above. Rather, the present invention can be applied to a wide range of high voltage switching circuit designs and applications, with alternative voltage values and operating parameters.

The described embodiments of the present invention are intended to be illustrative rather than restrictive, and are not intended to represent every embodiment of the present invention. Various modifications and variations can be made without departing from the spirit or scope of the invention as set forth in the following claims both literally and in equivalents recognized in law.

What is claimed is:

1. A power switching circuit for radiation environments using non-radiation hardened components, the power switching circuit comprising:

a first semiconductor switching device having a positive threshold voltage and a first region coupled to a high voltage source, the first semiconductor switching device switching between OFF and saturation; and a second semiconductor switching device having a negative threshold voltage, the second semiconductor switching device having a source coupled to a second region of the first semiconductor switching device, and a gate coupled to a signal generating circuit, the second semiconductor switching device switching between OFF and saturation, wherein when the second semiconductor switching device is switched into saturation, the first semiconductor switching device is saturated nearly concurrently.

2. The power switching circuit as in claim 1, wherein the first semiconductor switching circuit is an N-channel field effect transistor (N-FET) and the second semiconductor switching device is a P-channel field effect transistor (P-FET), the first region of the N-FET being a drain and the second region of the N-FET being a source.

3. The power switching circuit as in claim 2, wherein a gate of the N-FET is coupled to a biasing voltage.

4. The power switching circuit as in claim 2, wherein an output of the power switching circuit is coupled between the N-FET drain and the high voltage source.

5. The power switching circuit as in claim 4, wherein a zener diode is disposed between the source of the P-FET and ground for limiting voltage across the drain of the P-FET and the source of the P-FET and providing transient protection.

6. The power switching circuit as in claim 1, further comprising a transformer disposed between the signal generating circuit and the first semiconductor switching device and the second semiconductor switching device, for providing isolation of the signal generating circuit.

7. The power switching circuit as in claim 6, wherein a first secondary winding of the transformer provides a negative pulse signal to the gate of the second semiconductor switching device.

8. The power switching circuit as in claim 7, wherein a second secondary winding of the transformer provides a positive biasing voltage to a gate of the first semiconductor switching device.

9. The power switching circuit as in claim 1, wherein the first semiconductor switching circuit is an insulated-gate bipolar transistor (IGBT) and the second semiconductor switching device is a P-channel field effect transistor (P-FET), the first region of the IGBT being a collector and the second region of the IGBT being an emitter.

10. The power switching circuit as in claim 1, wherein the high voltage source is above 50 volts.

11. The power switching circuit as in claim 1, wherein nearly concurrently is concurrently.

12. The power switching circuit as in claim 1, wherein when the second semiconductor switching device is switched OFF, the first semiconductor switching device is switched OFF.

13. A power switching circuit for radiation environments using non-radiation hardened components, the power switching circuit comprising:

an N-channel field effect transistor (N-FET) having a drain coupled to a high voltage source and a gate coupled to a positive biasing voltage, the N-FET switching between OFF and saturation;

a P-channel field effect transistor (P-FET) having a source coupled to a source of the N-FET, and a gate coupled to a signal generating circuit the P-FET switching between OFF and saturation, wherein when the P-FET is switched into saturation, the N-FET is saturated nearly concurrently; and an output provided between the N-FET drain and the high voltage source.

14. The power switching circuit as in claim 13, wherein a zener diode is disposed between the P-FET source and ground for limiting voltage across the P-FET drain and P-FET source and providing transient protection.

15. The power switching circuit as in claim 13, further comprising a transformer disposed between the signal generating circuit and the P-FET and the N-FET, for providing isolation of the signal generating circuit.

16. The power switching circuit as in claim 15, wherein a first secondary winding of the transformer provides a negative pulse signal to the P-FET gate.

17. The power switching circuit as in claim 16, wherein a second secondary winding of the transformer provides the positive biasing voltage to the N-FET gate.

18. The power switching circuit as in claim 13, wherein nearly concurrently is concurrently.

19. The power switching circuit as in claim 13, wherein when the P-FET is switched OFF, the N-FET is switched OFF.

20. A power switching circuit for radiation environments using non-radiation hardened components, the power switching circuit comprising:

an insulated-gate bipolar transistor (IGBT) having a collector coupled to a high voltage source and a gate coupled to a positive biasing voltage, the IGBT switching between OFF and saturation;

a P-channel field effect transistor (P-FET) having a source coupled to an emitter of the IGBT, and a gate coupled to a signal generating circuit, the P-FET switching between OFF and saturation, wherein when the P-FET is switched into saturation, the IGBT is saturated nearly concurrently; and an output provided between the IGBT collector and the high voltage source.

21. The power switching circuit as in claim 20, further comprising a transformer disposed between the signal generating circuit and the P-FET and the IGBT, for providing isolation of the signal generating circuit.

22. The power switching circuit as in claim 21, wherein a first secondary winding of the transformer provides a negative pulse signal to the P-FET gate.

23. The power switching circuit as in claim 22, wherein a second secondary winding of the transformer provides a positive biasing voltage to the IGBT gate.

24. The power switching circuit as in claim 20, wherein nearly concurrently is concurrently.

25. The power switching circuit as in claim 20, wherein when the P-FET is switched OFF, the IGBT is switched OFF.

26. A method for initiating power switch in a radiation environment using non-radiation hardened components, the method comprising:

providing a switching component coupled to a high voltage source at a first end and a gate coupled to a positive biasing voltage the switching component switching between OFF and saturation; and controlling the switching component with a negatively driven semiconductor device, the negatively driven semiconductor device switching between OFF and saturation, the negatively driven semiconductor device and the switching component being switched into saturation nearly concurrently.

27. The method as in claim 26, further comprising providing a negative pulse drive signal to the semiconductor device.

28. The method as in claim 26, wherein the semiconductor device is a P-channel field effect transistor (P-FET), a source of the P-FET being coupled to a second end of the switching component.

29. The method as in claim 28, wherein the switching component is an N-channel field effect transistor (N-FET), the first end being a drain and the second end being a source.

30. The method as in claim 28, wherein the switching component is an insulated-gate bipolar transistor (IGBT), the first end being a collector and the second end being an emitter.

31. The method as in claim 26, wherein nearly concurrently is concurrently.

32. The method as in claim 26, wherein when the negatively driven semiconductor device is switched OFF and the switching component is switched OFF.

* * * * *